(12) United States Patent
Shin

(10) Patent No.: US 7,696,583 B2
(45) Date of Patent: Apr. 13, 2010

(54) THIN FILM TRANSISTOR AND METHOD OF FABRICATING THE SAME

(75) Inventor: Hyun-Eok Shin, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 207 days.

(21) Appl. No.: 11/529,361

(22) Filed: Sep. 29, 2006

(65) Prior Publication Data

US 2007/0075369 A1 Apr. 5, 2007

(30) Foreign Application Priority Data

Sep. 30, 2005 (KR) ...................... 10-2005-0092292

(51) Int. Cl.
*H01L 29/76* (2006.01)
*H01L 29/94* (2006.01)

(52) U.S. Cl. ...................... 257/382; 257/383; 257/388; 257/59; 257/72; 438/300

(58) Field of Classification Search ................. 257/382, 257/383, 388, 59, 72; 438/300
See application file for complete search history.

(56) References Cited

U.S. PATENT DOCUMENTS

| 6,850,005 | B2 * | 2/2005 | Yoneda et al. | .............. 313/506 |
| 2002/0109196 | A1 * | 8/2002 | Fujisawa et al. | ............ 257/384 |
| 2005/0250273 | A1 * | 11/2005 | Harano et al. | ............... 438/197 |

FOREIGN PATENT DOCUMENTS

CN 1637566 7/2005

OTHER PUBLICATIONS

Office Action issued on Jul. 25, 2008 in the corresponding Chinese Patent Application.
Office Action issued in Chinese Patent Application No. 2006101718946 on Dec. 11, 2009.

* cited by examiner

*Primary Examiner*—Kenneth A Parker
*Assistant Examiner*—Joseph Nguyen
(74) *Attorney, Agent, or Firm*—Stein McEwen, LLP

(57) ABSTRACT

A thin film transistor and a method of fabricating the same capable of reducing stress of a substrate caused by a metal layer of the drain and source electrodes, the thin film transistor including a substrate; a semiconductor layer disposed on the substrate and including source, drain and channel regions; a gate insulating layer disposed on the substrate including the semiconductor layer; a gate electrode disposed on the gate insulating layer to correspond to the channel region of the semiconductor layer; an interlayer insulating layer disposed on the substrate including the gate electrode, and having contact holes connected with the source and drain regions of the semiconductor layer; and source and drain electrodes connected with the source and drain regions through the contact holes, wherein the source and drain electrodes include a first metal layer, a second metal layer, and a metal oxide layer interposed between the first metal layer and the second metal layer. Accordingly, the thin film transistor can reduce stress of the substrate caused by a metal layer of the source and drain electrodes, thereby improving yield of an organic light emitting diode display device.

10 Claims, 3 Drawing Sheets

THIN FILM TRANSISTOR AND METHOD OF FABRICATING THE SAME

CROSS-REFERENCE TO RELATED APPLICATIONS

This application claims the benefit of Korean Patent Application No. 2005-92292, filed Sep. 30, 2005, the disclosure of which is incorporated herein by reference.

BACKGROUND OF THE INVENTION

1. Field of the Invention

An aspect of the present invention relates to a thin film transistor and a method of fabricating the same, and more particularly, to a thin film transistor and a method of fabricating the same, capable of reducing stress of a substrate caused by a metal layer from source and drain electrodes, thus increasing yield of devices when manufacturing the thin film transistor of an organic light emitting diode display device.

2. Description of the Related Art

In general, an organic light emitting diode display device (OLED) includes an anode, an organic emissive layer disposed on the anode, and a cathode disposed on the organic emissive layer. In the OLED, when an electrical current is applied to the anode, a hole is injected into the organic emissive layer from the anode, and an electron is injected into the organic emissive layer from the cathode. The hole and electron injected into the organic emissive layer are recombined in the organic emissive layer to create an exciton, and when such an exciton transitions from an excited state to a ground state, light is emitted.

Generally, the organic light emitting diode display device is classified into a passive matrix type and an active matrix type depending on the manner of driving N×M number pixels disposed in the form of a matrix.

In the active matrix type, a pixel electrode defining an emissive region and a unit pixel circuit for programming current data or voltage data to the pixel electrode are disposed in a unit pixel region. Since the unit pixel circuit includes at least one thin film transistor, the unit pixel circuit supplies a constant current regardless of the number of pixels of the organic light emitting diode display device so that it provides stable luminance and low power consumption characteristics, thereby easily realizing a high-resolution large-size display.

FIG. 1 is a cross-sectional view illustrating a related method of fabricating a thin film transistor of an organic light emitting diode display device.

Referring to FIG. 1, a buffer layer 11 is formed on a substrate 10, and then a semiconductor layer 12 is formed on the buffer layer 11.

A gate insulating layer 13 is formed on the semiconductor layer 12, and a gate electrode 15 is formed on the gate insulating layer 13 to correspond to a predetermined region of the semiconductor layer 12.

Subsequently, impurity ions are injected into the semiconductor layer 12 using the gate electrode 15 as a mask, thereby forming source and drain regions 12a and 12b, and defining a channel region 12c interposed between the source and drain regions 12a and 12b at the same time.

An interlayer insulating layer 16 is formed on the entire surface of the substrate including the gate electrode 15 and then etched to form contact holes 17 exposing each of the source and drain regions 12a and 12b in the interlayer insulating layer 16.

Next, a metal layer for source and drain electrodes is deposited on the interlayer insulating layer 16 and then patterned to thereby form source and drain electrodes 18a and 18b contacting the source and drain regions 12a and 12b, thereby fabricating a thin film transistor.

FIGS. 2A and 2B are cross-sectional views illustrating a related metal layer for source and drain electrodes.

Referring to FIG. 2A, the source and drain electrodes are formed of a metal, such as molybdenum (Mo), tungsten (W), molybdenum-tungsten (MoW) or titanium (Ti), and these metals are formed by sputtering at a high temperature and crystallized to have a regular direction in the shape of a column.

Accordingly, after forming the source and drain metal layers using a metal such as molybdenum, as illustrated in FIG. 2A, the substrate is bent by stress caused by the change in thermal expansion coefficient due to orientation of the metal layer and temperature drop.

Such a phenomenon occurs frequently as the thickness of the substrate becomes thinner. Moreover, when a photoresist is coated on the metal layer to pattern the metal layer, the substrate may be broken.

SUMMARY OF THE INVENTION

An aspect of the present invention provides a thin film transistor and a method of fabricating the same, which can improve yield of devices by reducing the stress on a substrate caused by a metal layer from source and drain electrodes.

In an embodiment of the present invention, a thin film transistor includes a substrate; a semiconductor layer disposed on the substrate and including source and drain regions and a channel region; a gate insulating layer disposed on the substrate including the semiconductor layer; a gate electrode disposed on the gate insulating layer to correspond to the channel region of the semiconductor layer; an interlayer insulating layer disposed on the substrate including the gate electrode, and having contact holes connected with the source and drain regions of the semiconductor layer; and source and drain electrodes connected with the source and drain regions through the contact holes, wherein the source and drain electrodes include a first metal layer, a second metal layer, and a metal oxide layer interposed between the first metal layer and the second metal layer.

In another embodiment of the present invention, a method of fabricating a thin film transistor includes preparing a substrate; forming a semiconductor layer including source and drain regions and a channel region on the substrate; forming a gate insulating layer on the substrate including the semiconductor layer; forming a gate electrode on the gate insulating layer to correspond to the channel region of the semiconductor layer; forming an interlayer insulating layer including contact holes connected with the source and drain regions of the semiconductor layer on the substrate including the gate electrode; forming a first metal layer connected with the source and drain regions through the contact holes; forming a metal oxide layer on the first metal layer; forming a second metal layer on the metal oxide layer; and etching the first metal layer, the metal oxide layer and the second metal layer, and forming source and drain electrodes.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
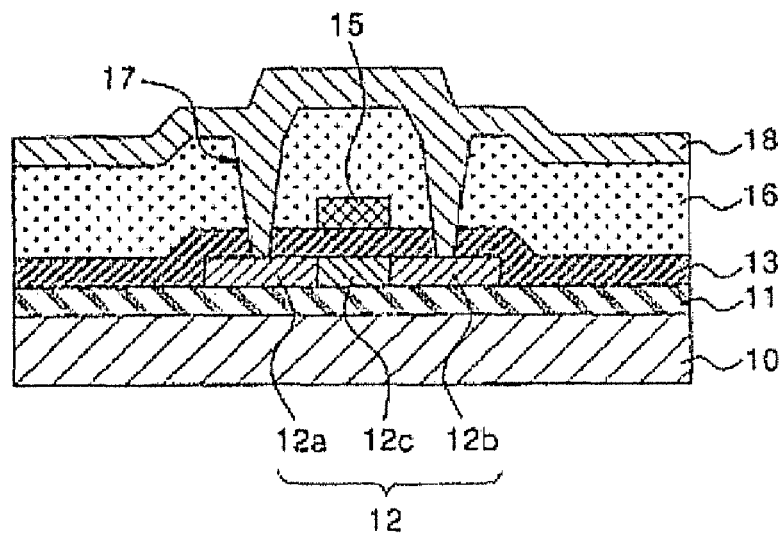
FIG. 1 is cross-sectional view illustrating a related method of fabricating a thin film transistor of an organic light emitting diode display device.
Figure 2A:
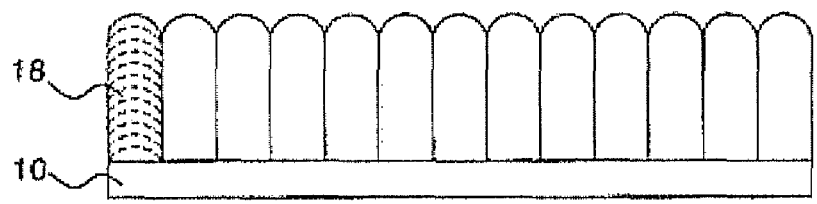
FIGS. 2A and 2B are cross-sectional views illustrating a related metal layer for source and drain electrodes.
Figure 2B:
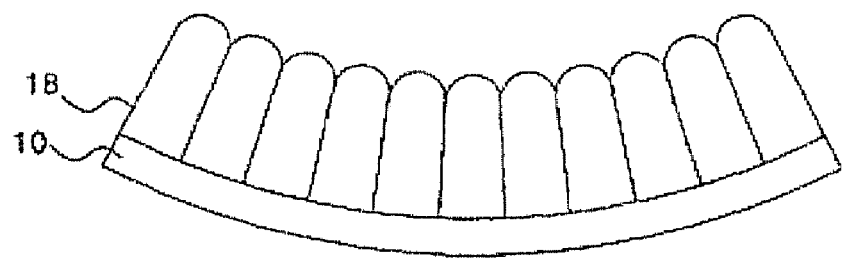

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3:
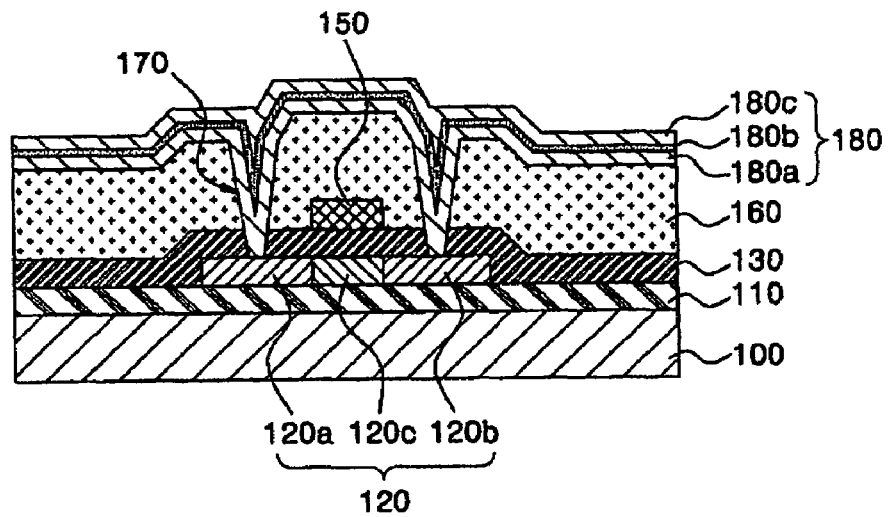
FIG. 3 is a cross-sectional view illustrating a method of fabricating a thin film transistor of an organic light emitting diode display device according to an embodiment of the present invention.

FIG. 3 is a cross-sectional view illustrating a method of fabricating a thin film transistor of an organic light emitting diode display device according to an embodiment of the present invention.

Referring to FIG. 3, a buffer layer 110 is formed on a substrate 100. The buffer layer 110 is formed to protect a thin film transistor to be formed in the following process from impurities out-diffused from the substrate 100. The buffer layer 110 may be formed of a silicon oxide ($SiO_2$) layer, a silicon nitride (SiNx) layer, or a composite layer thereof.

Subsequently, a semiconductor layer 120 is formed on the buffer layer 110. The semiconductor layer 120 may be formed of a polycrystalline silicon layer obtained by forming an amorphous silicon layer on the buffer layer 110, and crystallizing and then patterning the amorphous silicon layer using Excimer Laser Annealing (ELA), Sequential Lateral Solidification (SLS), Metal Induced Crystallization (MIC) or Meal Induced Lateral Crystallization (MILC).

Next, a gate insulating layer 130 is formed on the entire surface of the substrate including the semiconductor layer 120. The gate insulating layer 130 may be formed of a silicon oxide layer, a silicon nitride layer, or a composite layer thereof, which has excellent interfacial properties with the semiconductor layer 120, thereby increasing the insulation withstanding voltage of the gate insulating layer 130 and reducing influence by mobile charges. Accordingly, the thin film transistor can have enhanced electric characteristics.

A gate electrode 150 is formed on the gate insulating layer 130 to correspond to a predetermined region of the semiconductor layer 120. The gate electrode 150 may be formed of one of MoW, Mo, W and Al.

Subsequently, impurity ions are injected into the semiconductor layer 120 using the gate electrode 150 as a mask, thereby forming source and drain regions 120a and 120b, and defining a channel region 120c interposed between the source and drain regions 120a and 120b.

The impurity ions may be n-type or p-type impurity ions. The n-type impurity ions may be selected from the group consisting of phosphorus (P), arsenic (As), antimony (Sb) and bismuth (Bi). Also, the p-type impurity ions may be selected from the group consisting of boron (B), aluminum (Al), gallium (Ga) and indium (In).

An interlayer insulating layer 160 is formed on the entire surface of the substrate including the gate insulating layer 150. The interlayer insulating layer 160 may be formed of a silicon oxide layer, a silicon nitride layer, or a composite layer thereof, which is formed by PECVD or LPCVD.

Subsequently, contact holes 170 are formed in the interlayer insulating layer 160 to expose each of the source and drain regions 120a and 120b by an etching process.

Then, a first metal layer 180a is deposited on the interlayer insulating layer 160 including the contact holes 170. Here, the first metal layer 180a may be formed of a metal, such as Mo, W, MoW or Ti.

Here, the first metal layer 180a may be formed by sputtering, and formed to have a thickness of about 2500 Å, which is half the total thickness of the source and drain electrodes.

After forming the first metal layer 180a, a metal oxide layer 180b is formed on the first metal layer 180a and a second metal layer 180c is formed of the metal oxide layer 180b.

Figure 4A:
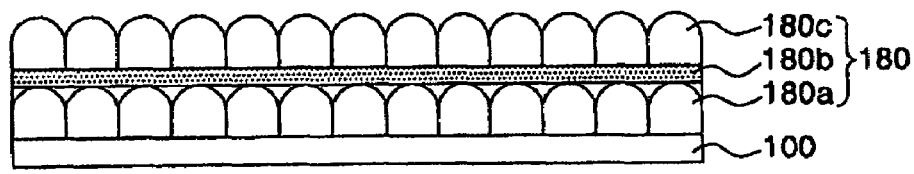
FIGS. 4A and 4B are cross-sectional views illustrating a metal layer for source and drain electrodes according to an embodiment of the present invention.
Figure 4B:
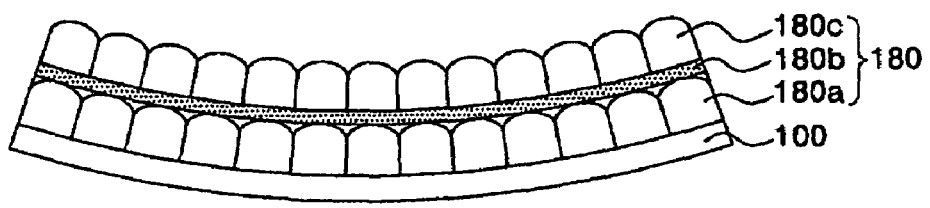

FIGS. 4A and 4B are cross-sectional views illustrating a metal layer for source and drain electrodes according to an exemplary embodiment of the present invention.

Referring to FIG. 4A, a metal oxide layer 180b is formed on a first metal layer 180a crystallized in the form of a column. When a second metal layer 180c is formed after the formation of the metal oxide layer 180b, since the crystallization direction of the second metal layer 180c does not match that of the first metal layer 180a, as shown in FIG. 4B, stress caused by crystallinity of the metal layer for source and drain electrodes is reduced, so that bending of the substrate can be reduced.

Here, the thickness of the metal oxide layer 180b is preferably 1 to 4% of the total thickness of the metal layer for source and drain electrodes, i.e., the first and second metal layers.

Accordingly, when the metal layer for source and drain electrodes is formed to have a thickness about 5000 Å, the metal oxide layer preferably has a thickness of 50 to 200 Å. As such, in order to mismatch the crystallization direction of the first and second metal layers 180a and 180c, the metal oxide layer may have a thickness of 50 Å or more which is at least 1% of the total thickness. Also, since electric charges move through the metal oxide layer 180b due to a tunneling phenomenon when current flows between the first and second metal layers 180a and 180c, the metal oxide layer may have a thickness of 200 Å or less, which is at most 4% of the total thickness.

The first metal layer 180a and the metal oxide layer 180b are preferably formed in situ by sputtering. This can be achieved by forming the first metal layer 180a by sputtering the metal material in a vacuum atmosphere, and then forming the metal oxide layer 180b by sputtering the metal material in an oxygen gas atmosphere.

Alternatively, the metal oxide layer 180b may be formed by a cleaning process using deionized water after forming the first metal layer 180a.

Subsequently, the second metal layer 180c is formed on the metal oxide layer 180b. Here, the second metal layer 180c may be formed of a metal, such as Mo, W, MoW, or Ti, and formed to have a thickness of about 2500 Å, which is half the total thickness of source and drain electrodes.

Here, the second metal layer 180c is preferably formed in situ by sputtering after forming the metal oxide layer 180b.

Subsequently, a photoresist is coated on the metal layer for source and drain electrodes, and then exposed and developed.

Thereby, the metal layer for source and drain electrodes 180 is patterned to form source and drain electrodes (not illustrated) contacting the source and drain regions 120*a* and 120*b* exposed in the contact holes 170.

Through such processes, a thin film transistor including the semiconductor layer 120, the gate electrode 150 and the source and drain electrodes (not illustrated) are completed.

Hereinafter, Examples of the present invention will be described. However, the aspects of the present invention are not limited to these Examples.

EXAMPLE

A semiconductor layer, a gate insulating layer and a gate electrode were formed on a substrate, and an interlayer insulating layer was stacked thereon. Subsequently, contact holes connected with source and drain regions of the semiconductor layer were formed in the interlayer insulating layer, and then a first metal layer was formed of MoW to have a thickness of about 2500 Å on the entire surface of the substrate including the contact holes. After that, a metal oxide layer was formed to have a thickness of about 50 Å on the first metal layer through a cleaning process, and a second metal layer was formed of MoW to have a thickness of about 2500 Å on the metal oxide layer.

Comparative Example

A semiconductor layer, a gate insulating layer and a gate electrode were formed on a substrate, and an interlayer insulating layer was stacked thereon. Subsequently, contact holes connected with source and drain regions of the semiconductor layer were formed in the interlayer insulating layer, and a metal layer for source and drain electrodes was formed of MoW to have a thickness of about 5000 Å on the entire surface of the substrate including the contact holes.

Figure 5:
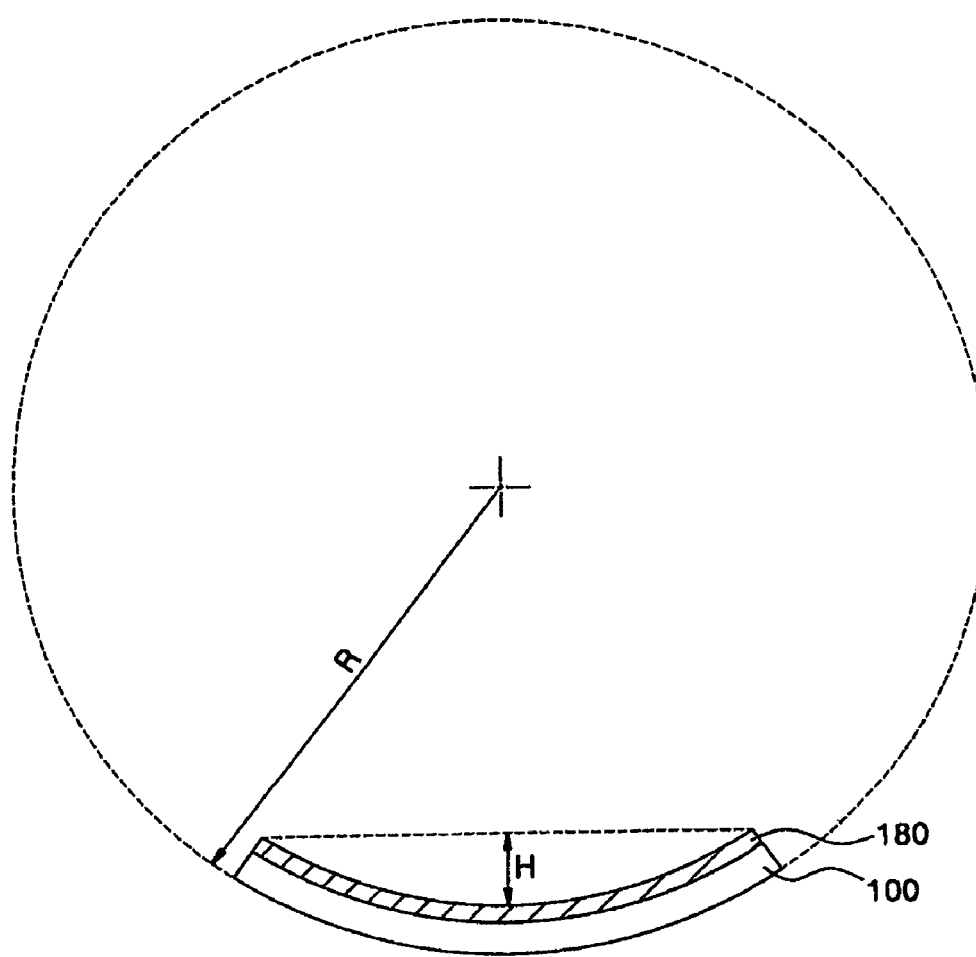
FIG. 5 shows the extent in which a substrate is bent by stress caused by a metal layer.

FIG. 5 shows the extent in which a substrate is bent by stress caused by a metal layer. The stress of the substrate can be represented as a pressure per unit area (dyne/cm$^2$), a radius (R) and a height (H).

TABLE 1

| Examples | Stress of substrate (dyne/cm$^2$) | Radius (R) (m) | Height (H) (m) |
|---|---|---|---|
| 1 | $3.16 \times e^8$ | 35.94 | 476.17 |
| 2 | $2.35 \times e^8$ | 47.17 | 362.80 |
| 3 | $3.32 \times e^8$ | 35.57 | 481.11 |

TABLE 2

| Comparative Examples | Stress of substrate (dyne/cm$^2$) | Radius (R) (m) | Height (H) (m) |
|---|---|---|---|
| 1 | $7.34 \times e^8$ | 25.67 | 666.53 |
| 2 | $1.11 \times e^9$ | 26.15 | 654.43 |
| 3 | $8.06 \times e^8$ | 22.67 | 754.93 |

Tables 1 and 2 show results obtained by measuring the stress of the substrate formed according to Examples and Comparative Examples, respectively.

As can be seen from Tables 1 and 2, in the case of Examples in which the first metal layer was formed, and then the metal oxide layer and the second metal layer were formed, it can be noted that a pressure applied to the substrate per unit area was reduced to almost ½.

Also, when the bending of the substrate decreases, the radius (R) of Examples increased about 10 m compared to the radius of Comparative Examples, and the height (H) of Examples decreased 200 m or more compared to that of Comparative Examples. Thus, when the source and drain metal layers were formed according to an aspect of the present invention, it can be noted that the stress of the substrate was significantly reduced.

As described above, an aspect of the present invention can reduce the stress of a substrate caused by a metal layer of the source and drain electrodes. Thus, an aspect of the invention can improve reliability of a thin film transistor and yield of an organic light emitting diode display device.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor, comprising:
   a substrate;
   a semiconductor layer disposed on the substrate and including source and drain regions and a channel region;
   a gate insulating layer disposed on the semiconductor layer;
   a gate electrode disposed on the gate insulating layer to correspond to the channel region of the semiconductor layer;
   an interlayer insulating layer disposed on the gate electrode, and having contact holes connected with the source and drain regions of the semiconductor layer; and
   source and drain electrodes connected with the source and drain regions through the contact holes, wherein the source and drain electrodes include a first metal layer, a second metal layer, and a metal oxide layer interposed between the first metal layer and the second metal layer,
   wherein the metal oxide layer contacts with the first metal layer and the second metal layer,
   and the first metal layer and the second metal layer are formed of the same material and have different crystallization directions from each other.

2. The thin film transistor according to claim 1, wherein the first metal layer or the second metal layer is formed of one selected from the group consisting of Mo, W, MoW and Ti.

3. The thin film transistor according to claim 1, wherein the metal oxide layer has a thickness of 1 to 4% of the total thickness of the first and second metal layers.

4. The thin film transistor according to claim 1, wherein the metal oxide layer has a thickness of 50 to 200 Å.

5. The thin film transistor according to claim 1, wherein the first metal layer is crystallized in a form of a column.

6. A thin film transistor, comprising:
   a substrate;
   a semiconductor layer disposed on the substrate and including source, drain and channel regions;
   a gate electrode disposed on the semiconductor layer to correspond to the channel region of the semiconductor layer;
   an interlayer insulating layer disposed on the substrate including the gate electrode, and having contact holes connected with the source and drain regions of the semiconductor layer; and
   source and drain electrodes connected with the source and drain regions through the contact holes, wherein the source and drain electrodes include a first metal layer and a second metal layer, the metal layers having different crystallization directions from each other,
wherein the source and drain electrodes further comprise a metal oxide layer in contact with the first metal layer and the second metal layer,
and the first metal layer and the second metal layer are formed of the same material.

7. The thin film transistor according to claim 6, wherein the source and drain electrodes further comprise a metal oxide layer interposed between the first metal layer and the second metal layer.

8. The thin film transistor according to claim 6, wherein the first metal layer or the second metal layer is formed of one selected from the group consisting of Mo, W, MoW and Ti.

9. The thin film transistor according to claim 7, wherein the metal oxide layer has a thickness of 1 to 4% of the total thickness of the first and second metal layers.

10. The thin film transistor according to claim 7, wherein the metal oxide layer has a thickness of 50 to 200 Å.

* * * * *